(12) United States Patent
Feki et al.

(10) Patent No.: US 8,891,317 B2
(45) Date of Patent: Nov. 18, 2014

(54) VOLATILE MEMORY WITH A DECREASED CONSUMPTION

(71) Applicant: STMicroelectronics SA, Montrouge (FR)

(72) Inventors: Anis Feki, Grenoble (FR);
Jean-Christophe Lafont, Meylan (FR);
David Turgis, le Touvet (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 13/758,536

(22) Filed: Feb. 4, 2013

(65) Prior Publication Data
US 2013/0201771 A1    Aug. 8, 2013

(30) Foreign Application Priority Data
Feb. 3, 2012   (FR) ...................... 12 51036

(51) Int. Cl.
| | | |
|---|---|---|
| *G11C 8/00* | (2006.01) | |
| *G11C 7/00* | (2006.01) | |
| *G11C 5/06* | (2006.01) | |
| *G11C 5/02* | (2006.01) | |
| *G11C 11/419* | (2006.01) | |
| *G11C 8/12* | (2006.01) | |
| *G11C 8/14* | (2006.01) | |
| *G11C 8/16* | (2006.01) | |
| *G11C 14/00* | (2006.01) | |
| *G11C 13/00* | (2006.01) | |

(52) U.S. Cl.
CPC .............. *G11C 7/00* (2013.01); *G11C 14/0054* (2013.01); *G11C 8/00* (2013.01); *G11C 13/0069* (2013.01); *G11C 11/419* (2013.01); *G11C 8/12* (2013.01); *G11C 8/14* (2013.01); *G11C 8/16* (2013.01)

USPC ............... 365/189.011; 365/154; 365/189.02; 365/189.15; 365/189.16; 365/230.03; 365/230.04; 365/230.06

(58) Field of Classification Search
CPC .... G11C 14/0054; G11C 8/00; G11C 11/419; G11C 7/00; G11C 13/0069
USPC ............ 365/154, 155, 156, 189.011, 189.02, 365/189.15, 189.16, 230.02, 230.03, 365/230.04, 230.06
See application file for complete search history.

(56) References Cited

U.S. PATENT DOCUMENTS

| | | | |
|---|---|---|---|
| 6,084,819 A | 7/2000 | Kablanian | |
| 6,373,753 B1 * | 4/2002 | Proebsting | ............... 365/189.09 |

(Continued)

OTHER PUBLICATIONS

French Search Report of Application No. 1251036 mailed Oct. 2, 2012, 8 pages.

(Continued)

*Primary Examiner* — Ly D Pham
(74) *Attorney, Agent, or Firm* — Slater & Matsil, L.L.P.

(57) ABSTRACT

A volatile memory including volatile memory cells adapted to the performing of data write and read operations. The memory cells are arranged in rows and in columns and, further, are distributed in separate groups of memory cells for each row. The memory includes a first memory cell selection circuit configured to perform write operations and a second memory cell selection circuit, different from the first circuit, configured to perform read operations. The first circuit is capable of selecting, for each row, memory cells from one of the group of memory cells for a write operation. The second circuit is capable of selecting, for each row, memory cells from one of the groups of memory cells for a read operation.

18 Claims, 4 Drawing Sheets

(56) References Cited

U.S. PATENT DOCUMENTS

| 7,092,279 | B1 | 8/2006 | Sheppard | |
|---|---|---|---|---|
| 2010/0124099 | A1 | 5/2010 | Wu et al. | |
| 2014/0085972 | A1* | 3/2014 | Ueda | 365/158 |
| 2014/0092692 | A1* | 4/2014 | Tsai | 365/189.05 |

OTHER PUBLICATIONS

"A Static RAM Says Goodby to Data Errors," IEEE Spectrum, Feb. 2004, 2 pages.

Anh-Tuan, et al., "An 8T Differential SRAM with Improved Noise Margin for Bit-Interleaving in 65 nm CMOS," IEEE Transactions on Circuits and Systems—I: Regular Papers, vol. 58, No. 6, Jun. 2011, 12 pages.

Calhoun, et al., "A 256kb Sub-threshold SRAM in 65nm CMOS," ISSCC 2006, Session 34, SRAM, 34.4, Date of Conference: Feb. 6-9, 2006, 10 pages.

Chandra, et al., "Impact of Technology and Voltage Scaling on the Soft Error Susceptibility in Nanoscale CMOS," IEEE International Symposium on Defect and Fault Tolerance of VLSI Systems, Date of Conference: Oct. 1-3, 2008, 9 pages.

Chang, et al., "A 32kb 10T subthreshold SRAM array with bit-interleaving and differential read scheme in 90nm CMOS," Purdue University, Purdue e-Pubs, Jan. 2008, 4 pages.

Kim, et al., "A 0.2 V, 480 kb Subthreshold SRAM with 1 k Cells Per Bitline for Ultra-Low-Voltage Computing," IEEE Journal of Solid-State Circuits, vol. 43, No. 2, Feb. 2008, 12 pages.

Kurd, et al., "Westmere: A Family of 32nm IA Processors," ISSCC 2010, Session 5, Processors, 5.1, IEEE International Solid-State Circuits Conference, Date of Conference: Feb. 2010, 3 pages.

Liu, et al., "Trading Speed for Low Power by Choice of Supply and Threshold Voltages," IEEE Journal of Solid-State Circuits, vol. 28, No. 1, Jan. 1993, 8 pages.

Markovic, et al., "Ultralow-Power Design in Near-Threshold Region," vol. 98, No. 2, Feb. 2010, 16 pages.

Noguchi, et al., "A 10T Non-Precharge Two-Port SRAM for 74% Power Reduction in Video Processing," IEEE Computer Society Annual Symposium on VLSI, May 2007, 6 pages.

Slayman, "Soft Errors—Past History and Recent Discoveries," Integrated Reliability Workshop Final Report, Date of Conference: Oct. 17-21, 2010, 6 pages.

Song, et al., "Fully-gated ground 10T-SRAM bitcell in 45 nm SOI technology," Electronics Letters, vol. 46, No. 7, Apr. 1, 2010, 2 pages.

Wang, et al., "Optimal Supply and Threshold Scaling for Subthreshold CMOS Circuits," IEEE Computer Society Annual Symposium on VLSI, Meeting Date Apr. 25-26, 2002, 5 pages.

Wu, Jui-Jen, et al., "A large $\sigma$VTH/VDD Tolerant Zigzag 8T SRAM with Area-Efficient Decoupled Differential Sensing and Fast Write-Back Scheme," Apr. 2011, IEEE, Symposium on VLSI Circuits/ Technical Digest of Technical Papers, 13 pages.

Ya-Qi, et al., "40nm10T SRAM Cell with Independent SNM WM and Suppress Active and Leakage Power," Date of Conference: Nov. 1-4, 2010, 3 pages.

* cited by examiner

VOLATILE MEMORY WITH A DECREASED CONSUMPTION

CROSS-REFERENCE TO RELATED APPLICATIONS

This application claims the priority benefit of French patent application number 12/51036, filed on Feb. 3, 2012, which is hereby incorporated by reference to the maximum extent allowable by law.

TECHNICAL FIELD

The present disclosure relates to integrated circuits comprising volatile memory elements.

BACKGROUND

An integrated circuit memory may be formed of an assembly of memory elements, or memory cells, which may be arranged in an array. The data writing into and reading from memory cells are performed by means of dedicated logic circuits. A power supply generally provides the power necessary to the proper operation of the memory cell components and of the logic circuit. The memory power supply is generally obtained by one or several rails connected to all the memory cells and transmitting a power supply voltage. A memory is called volatile in the case where the data stored in the memory cells risk being lost when the memory power supply voltage falls below a minimum threshold.

FIG. 1 shows an embodiment of a volatile memory cell 5 of a volatile memory of static random access memory type (SRAM). Memory cell 5 comprises six metal-oxide gate field-effect transistors, also called MOS transistors. Memory cell 5 belongs to a memory plane where the memory cells are distributed in rows and in columns.

Memory cell 5 comprises inverters INVL, INVR connected in antiparallel. Inverters INVL, INVR are connected between a source of a high voltage VDD and a source of a low voltage, generally ground GND. In the following description, the ground voltage is selected to be equal to 0 V. Inverter INVL comprises a P-type MOS transistor PUL having its source connected to voltage source VDD and having its drain connected to a node IL corresponding to the input of inverter INVR. Inverter INVL comprises an N-type MOS transistor PDL having its source connected to ground GND and having its drain connected to node IL. Inverter INVR comprises a P-type MOS transistor PUR having its source connected to the source of voltage VDD and having its drain connected to a node IR corresponding to the input of inverter INVL. Inverter INVR comprise an N-type MOS transistor PDR having its source connected to ground GND and having its drain connected to node IR. The gates of transistors PUL and PDL are connected to node IR and the gates of transistors PUR and PDR are connected to node IL.

Nodes IL and IR are connected to bit lines BLT and BLF via switches PGL and PGR controlled by a row selection signal transmitted by a word line WL. Switch PGL may be an N-type MOS transistor having its gate connected to word line WL and having its other conduction terminals respectively connected to bit line BLT and to node IL. Similarly, switch PGR may be an N-type MOS transistor having its gate connected to word line WL and having its other conduction terminals respectively connected to node IR and to bit line BLF. Word line WL extends over the memory row comprising memory cell 5 and is connected to each memory cell in the row. Bit lines BLT and BLF extend on the memory column to which memory cell 5 belongs and are connected to each memory cell in the column.

In the following description, a bit or word line is said to be in the low state when the voltage on this line is at a low level, for example, at ground voltage GND, and a bit or word line is said to be in the high state when the voltage on this line is at a high level, for example, approximately equal to power supply voltage VDD. However, the high and low levels may be different for each word and bit line.

Memory cell 5 enables to store a binary datum or bit "0" or "1". As an example, the storage of datum "1" corresponds to the case where the voltage at node IL is in the high state and the voltage at node IR is in the low state and the storage of datum "0" corresponds to the case where the voltage at node IL is in the low state and the voltage at node IR is in the high state.

For certain applications, the consumption of the integrated circuit comprising a volatile memory is a critical factor. This may concern medical applications or wireless applications which require a low consumption. As an example, the integrated circuit may be provided on medical implants, portable electronic elements, or a sensor network. It is, for example, an integrated circuit equipping the cell phone, the integrated circuit being powered by the phone battery.

A reduction of the memory consumption may be obtained by decreasing the memory power supply voltage. However, the decrease of the power supply voltage may cause read errors in an operation of reading of the datum stored in memory cell 5.

Indeed, in an operation of reading of the datum stored in a memory cell, word line WL associated with the selected memory cell is set to the high state and the word lines of all the other memory rows are set to the low state. Switches PGL and PGR of the selected memory cell 5 are thus off. Bit lines BLT and BLF are left floating. According to the datum stored in the memory cell, the voltage of one of bit lines BLT, BLF rises and the voltage of the other bit line BLT, BLF decreases. However, even if switches PGL and PGR of all the other memory cells of the column are on, leakage currents may flow for these memory cells through some of switches PGL and PGR. With the decrease of power supply voltage VDD, the total leakage current corresponding to the sum of the leakage currents of the unselected memory cells of the column may cause incorrect variations of the voltages of bit lines BLT and BLF and thus read errors. It is then necessary to decrease the number of memory cells per column.

FIG. 2 shows an embodiment of a memory cell 10 such as that described in publication "A large σVTH/VDD tolerant Zigzag 8T SRAM with Area-Efficient decoupled differential sensing and fast write-back scheme" by Jui-Jen Wu, Yen-Huei Chen, Meng-Fan Chang, Po-Wei Chou, Chien-Yuan Chen, Hung-Jen Liao, Ming-Bin Chen, Yuan-Hua Chu, Wen-Chin Wu, and Hiroyuki Yamauchi (IEEE Journal of Solid-State Circuits, Vol. 46, No 4, April 2011).

As compared with cell 5 shown in FIG. 1, memory cell 10 further comprises two read bit lines RBLT and RBLF, a read word line RWL, and two N-type MOS transistors, RPDL and RPDR, dedicated to read operations. The gate of transistor RPDL is connected to node IL. One of the conduction terminals of transistor RPDL is connected to read bit line RBLT and the other conduction terminal of transistor RPDL is connected to read word line RWL. The gate of transistor RPDR is connected to node IR. One of the conduction terminals of transistor RPDR is connected to read bit line RBLF and the other conduction terminal of transistor RPDR is connected to read word line RWL. Word line WL and bit lines BLT and BLF are dedicated to write operations.

In a write operation or a retention operation (between read and/or write operation), read bit lines RBLT and RBLF are set to VDD.

In a read operation, read bit lines RBLT and RBLF are left floating and read word line RWL of the selected memory cell 10 is set to the low state while the word lines RWL associated with the other memory rows are maintained in the high state. When datum '1' is stored in memory cell 5, only transistor RPDR is conductive. The voltage of bit line RBLF decreases. Transistor RPDL is off and bit line RBLT remains in the high state. Voltage difference Vdiff between bit lines RBLT and RBLF can then be detected. The time for which read word line RWL is set to the low state is sufficiently short for voltage Vdiff to remain smaller than the threshold voltage of transistors RPDL and RPDR. For the other memory cells of the column, the gate-source voltage of transistors RPDL and RPDR is at most equal to Vdiff. These transistors thus remain off. Further, the drain-source voltage of transistors RPDL and RPDR of the unselected memory cells of the column is at most equal to Vdiff so that the leakage currents remain low as compared with those obtained for memory cell 5. Read errors are thus decreased even if the number of memory cells per column is high.

However, memory cell 10 shown in FIG. 2 has several disadvantages.

FIG. 3 illustrates disadvantages of a memory 15 comprising memory cells 10, two memory cells Cell1 and Cell2 being shown.

The consumption of memory 15 is increased with the appearing of parasitic currents during write operations. As an example, an operation of writing of a datum into memory cell Cell1 while no datum is to be written into memory Cell2 is considered. To achieve this, word line WL is set to the high state. One of bit lines BLT or BLF of memory cell Cell1 is set to the high state and the other bit line BLT or BLF is set to the low state according to the datum to be written into memory cell Cell1. Bit lines BLT and BLF associated with memory cell Cell2 are both left floating in the high state. Since switches PGL and PGR of memory cell Cell2 are on and one of transistors PDL or PDR is on, a parasitic current flows from one of bit lines BLT or BLF associated with memory cell Cell2 to ground GND.

The consumption of memory 15 is further increased by the appearing of parasitic currents in read operations. As an example, an operation of reading of the datum stored in memory cell Cell1 while no datum is to be read from memory Cell2 is considered. In a read operation, word line RWL is set to the low state. Bit lines RBLT and RBLF associated with memory cell Cell1 are both left floating in the high state. According to the datum stored in memory cell Cell1, the voltage of one of the two bit lines RBLT or RBLF decreases. Bit lines RBLT and RBLF associated with memory cell Cell2 may be left floating in the high state. Since one of transistors RPDL or RPDR of memory cell Cell2 is on, a parasitic current thus flows between one of bit lines RBLT and RBLF associated with memory cell Cell2 and read line RWL.

A memory cell overcoming all or part of the previously-described disadvantages is thus needed.

SUMMARY OF THE INVENTION

An embodiment provides a volatile memory with a low power supply voltage which has smaller parasitic currents in read and write operations.

Thus, an embodiment provides a volatile memory comprising volatile memory cells adapted to the performing of data write and read operations. The memory cells are arranged in rows and in columns and, further, are distributed in separate groups of memory cells for each row. The memory comprises a first memory cell selection circuit configured to perform write operations and a second memory cell selection circuit, different from the first circuit, configured to perform read operations. The first circuit is capable of selecting, for each row, memory cells from one of the groups of memory cells for a write operation. The second circuit is capable of selecting, for each row, memory cells from one of the groups of memory cells for a read operation.

According to an embodiment, the second selection circuit comprises read word lines for each row, each read word line being connected to all the memory cells of one of the groups of memory cells.

According to an embodiment, each memory cell comprises:
  first and second inverters, the output of the first inverter being connected to the input of the second inverter and the output of the second inverter being connected to the input of the first inverter;
  a first switch connected to the output of the first inverter;
  a second switch connected to the output of the second inverter;
  a first MOS transistor having two first conduction terminals and a first gate, the first gate being connected to the output of the first inverter;
  a second MOS transistor having two second conduction terminals and a second gate, the second gate being connected to the output of the second inverter,
  each read word line being connected to one of the first conduction terminals and to one of the second conduction terminals,
  the first selection circuit comprising a circuit capable of turning on the first and second switches of one of the groups of memory cells.

According to an embodiment, the memory comprises first and second read bit lines for each column and, for at least some memory cells in each column, the other one of the first conduction terminals of the first MOS transistor is connected to the first read bit line and the other one of the second conduction terminals of the second MOS transistor is connected to the second read bit line.

According to an embodiment, the first switch comprises a third MOS transistor connecting the output of the first inverter to a first write bit line and the second switch comprises a fourth MOS transistor connecting the output of the second inverter to a second write bit line.

According to an embodiment, the first selection circuit comprises write word lines for each row, each write word line being connected to the gates of the third and fourth MOS transistors of the memory cells of one of the groups of memory cells.

According to an embodiment, the first selection circuit comprises a third inverter, the output of the third inverter being connected to the gates of the third and fourth transistors and the input of the third inverter being connected to a write word line.

According to an embodiment, the first selection circuit comprises a fifth MOS transistor interposed between the third MOS transistor and the first write bit line and a sixth MOS transistor interposed between the fourth MOS transistor and the second write bit line.

Another embodiment provides an electronic device comprising a battery and a memory such as previously defined, powered by the battery.

Another embodiment provides a method for reading data stored in the memory such as previously defined comprising, for a memory row, the setting to a first level of one of the read word lines associated with the row, while the other read word lines associated with the row are maintained at a second level greater than the first level.

The foregoing and other features and advantages will be discussed in detail in the following non-limiting description of specific embodiments in connection with the accompanying drawings.

DETAILED DESCRIPTION OF ILLUSTRATIVE EMBODIMENTS

Figure 1:
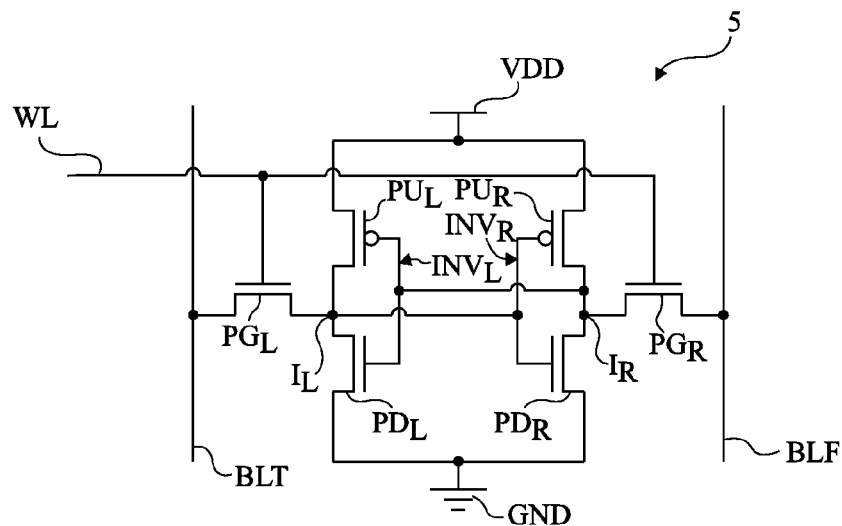
FIGS. 1 and 2 schematically show known examples of volatile memory cells with a decreased power supply voltage.

For clarity, the same elements have been designated with the same reference numerals in the different drawings. In the following description, expression "conduction terminal" of a MOS transistor indifferently designates the MOS transistor source or drain.

The memory cells according to the embodiments described hereinafter may be powered at a decreased power supply voltage VDD. As an example, voltage VDD may be on the order of 400 mV, especially when the memory cells are formed in a technology for which the channel length of MOS transistors is 32 nm. In particular, the memory cells according to the embodiments described hereinafter are capable of operating under the MOS transistor threshold voltage.

Figure 2:
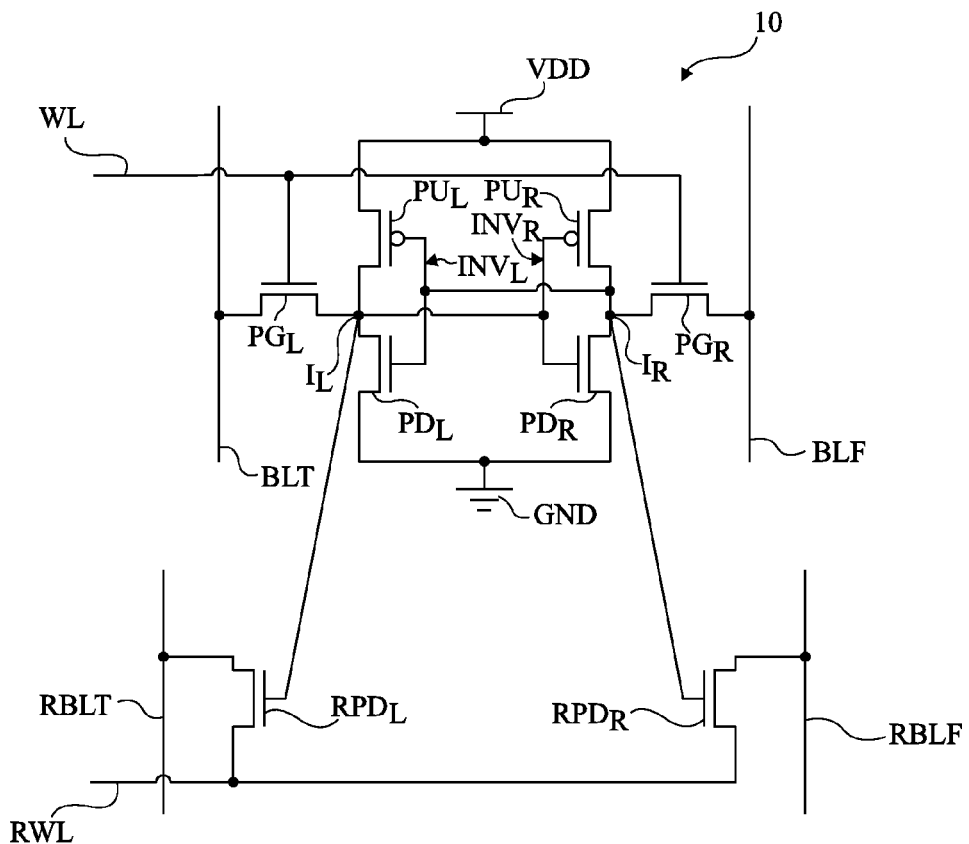
Figure 3:
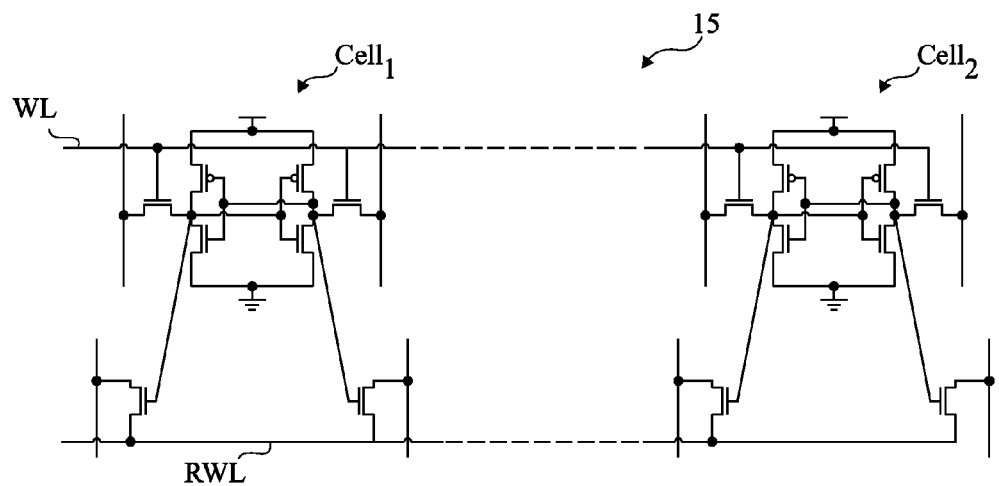
FIG. 3 schematically shows a row of a volatile memory comprising memory cells such as shown in FIG. 2.
Figure 4:
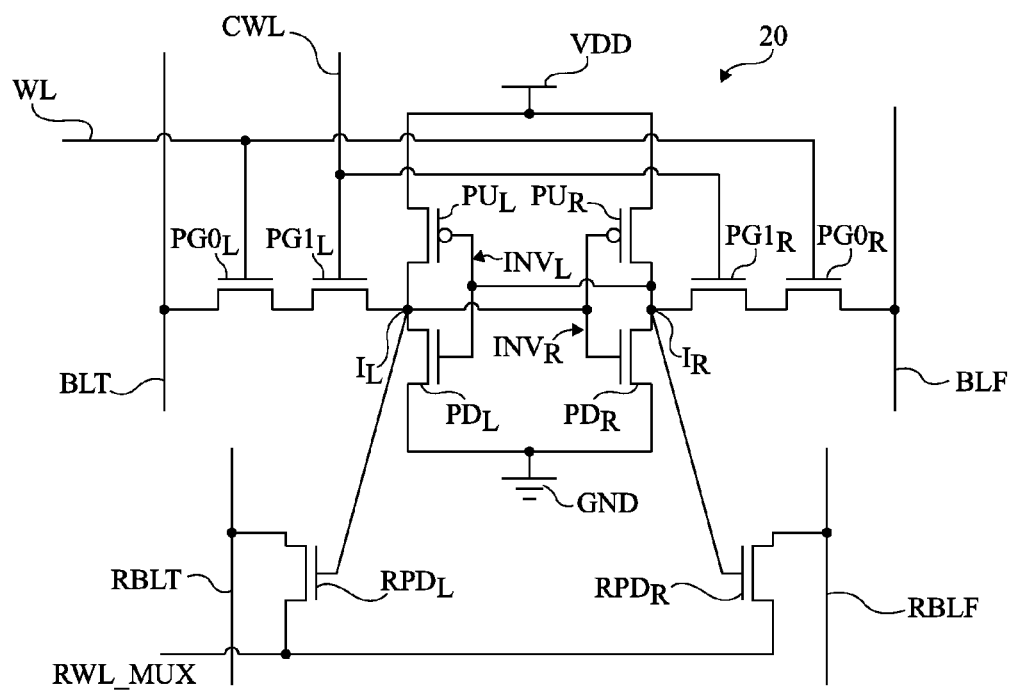
FIG. 4 shows an embodiment of a volatile memory cell having a decreased power supply voltage.

FIG. 4 shows an embodiment of a volatile memory cell 20. As compared with memory cell 10 shown in FIG. 2, memory cell 20 comprises two additional MOS transistors. Transistor PGL of memory cell 10 is replaced with two N-type MOS transistors, PG0L and PG1L. The gate of transistor PG0L is connected to word line WL. The gate of transistor PG1L is connected to a control line CWL. One of the conduction terminals of transistor PG0L is connected to bit line BLT and the other conduction terminal of transistor PG0L is connected to one of the conduction terminals of transistor PG1L. The other conduction terminal of transistor PG1L is connected to node IL. Similarly, transistor PGR is replaced with two N-type MOS transistors PG0R and PG1R. The gate of transistor PG0R is connected to word line WL. The gate of transistor PG1R is connected to control line CWL. One of the conduction terminals of transistor PG0R is connected to bit line BLF and the other conduction terminal of transistor PG0R is connected to one of the conduction terminals of transistor PG1R. The other conduction terminal of transistor PG1R is connected to node IR. Word line WL is connected to each memory cell of the row to which memory cell 20 belongs. Control line CWL is connected to each memory cell of the column to which memory cell 20 belongs.

Further, word line RWL of memory cell 10 is replaced with a word line RWL_MUX, which is only connected to some of the memory cells of the row to which memory cell 20 belongs. Thereby, the memory comprises, for each row, several word lines RWL_MUX, each word line RWL_MUX being connected to a different portion of the memory cells of the row.

As an example, a memory row may approximately comprise from 16 to 256 memory cells 20 per row and from 2 to 8 read word lines RWL_MUX per row, approximately. Each read word line RWL_MUX may be connected to from 8 to 32 memory cells per row, approximately.

Memory cell 20 operates as follows.

In the absence of any read or write operation in the row containing memory cell 20, the states of the word, bit, and control lines are the following:
 write word line WL is in the low state;
 control line CWL is in the low state;
 write bit line BLT is in the low state;
 write bit line BLF is in the low state;
 read bit line RBLT is in the high state;
 read bit line RBLF is in the high state; and
 read word lines RWL_MUX associated with the row containing memory cell 20 are in the high state.

The leakage currents through off transistors PG0L, PG1L, PG0R, PG1R are decreased since transistors PG0L, PG1L are in series and, since transistors PG0R, PG1R are in series, the resistance to the leakage current is greater than for memory cell 10.

In an operation of writing of a datum "0" (respectively a datum "1") into memory cell 20, the states of the word, bit, and control lines are the following:
 write word line WL is in the high state;
 control line CWL is in the high state;
 write bit line BLT is in the low state (respectively in the high state);
 write bit line BLF is in the high state (respectively in the low state);
 read bit line RBLT is in the high state;
 read bit line RBLF is in the high state; and
 read word lines RWL_MUX associated with the row containing the memory cell are in the high state.

The structure of memory cell 20 enables to perform an individual memory cell selection from among the memory cells of a same row in write operations. For the unselected memory cells of the same row, write word line WL is in the high state and the associated control lines CWL are in the low state. Switches PG1L and PG1R of these cells are thus off. The leakage currents of the unselected memory cells 20 are smaller than the parasitic currents appearing for the unselected memory cells 10 for which switches PGL and PGR remain off in a write operation. The memory consumption is thus decreased in a write operation.

In an operation of reading of the datum stored in memory cell 20, the states of the word, bit, and control lines are the following:
 write word line WL is in the low state;
 control line CWL is in the low state;
 write bit line BLT is in the low state;|
 write bit line BLF is in the low state;
 read bit lines RBLT and RBLF are initially floating in the high state; and
 read word line RWL_MUX associated with memory cell 20 is in the low state while the read word lines associated with the unselected memory cells of the row are in the high state.

The leakage currents through off transistors PG0L, PG1L, PG0R, PG1R are decreased since transistors PG0L, PG1L are in series and, since transistors PG0R, PG1R are in series, the resistance to the leakage current is greater than for memory cell 10.

Since read word lines RWL_MUX of the unselected memory cells are maintained in the high state and the associated read bit lines RBLT and RBLF are in the high state, there is no leakage current for these memory cells. The memory consumption in a read operation is thus decreased.

When power supply voltage VDD of the memory cells decreases, the memory becomes more sensitive to disturbances due to ionizing radiations. An ionizing ray generally tends to disturb adjacent memory cells.

The bits are generally stored in the memory in the form of groups of bits, called words. It may be advantageous to arrange the bits in the memory so that the bits stored in adjacent memory cells belong to separate words. Such a storage method is called bit interleaving.

Memory cell 20 eases the implementation of a bit interleaving in write and in read mode.

Figure 5:
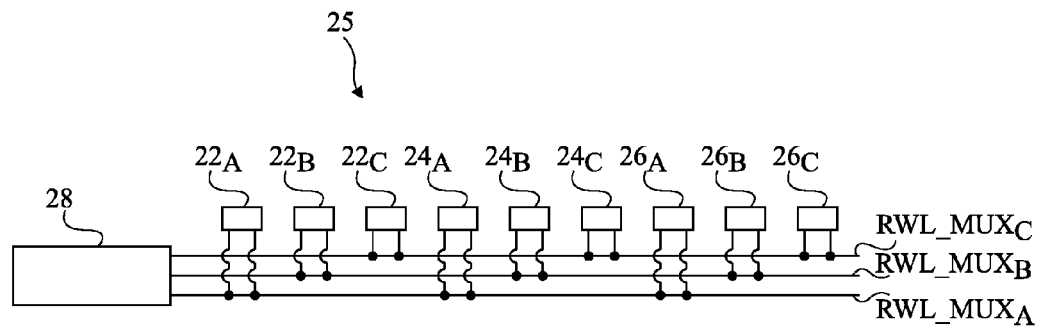
FIG. 5 schematically shows a row of a volatile memory comprising memory cells such as shown in FIG. 4.

FIG. 5 schematically shows 22A, 22B, 22C, 24A, 24B, 24C and 26A, 26B, 26C of a row of a volatile memory 25. Memory 25 further comprises three read word lines RWL_MUXA, RWL_MUXB, and RWL_MUXC associated with the row. Read word lines RWL_MUXA, RWL_MUXB, and RWL_MUXC are connected to a multiplexing unit 28. As an example, read word line RWL_MUXA is only connected to memory cells 22A, 24A, and 26A. Read word line RWL_MUXB is only connected to memory cells 22B, 24B, and 26B and read word line RWL_MUXC is only connected to memory cells 22C, 24C, and 26C. The number of read word lines depends on the number of groups of memory cells to be selected separately from the other memory cells in the row.

In write mode, the bit interleaving method may be implemented by only selecting the memory cells 20 desired by write word line WL and control line CWL. In read mode, the interleaving method may be implemented by read word lines RWL_MUXA, RWL_MUXB, RWL_MUXC. As an example, when a read operation must be carried out in memory cells 22A, 24A, and 26A, read line RWL_MUXA is set to the low state while the other read lines RWL_MUXB and RWL_MUXC are maintained in the high state.

Figure 6:
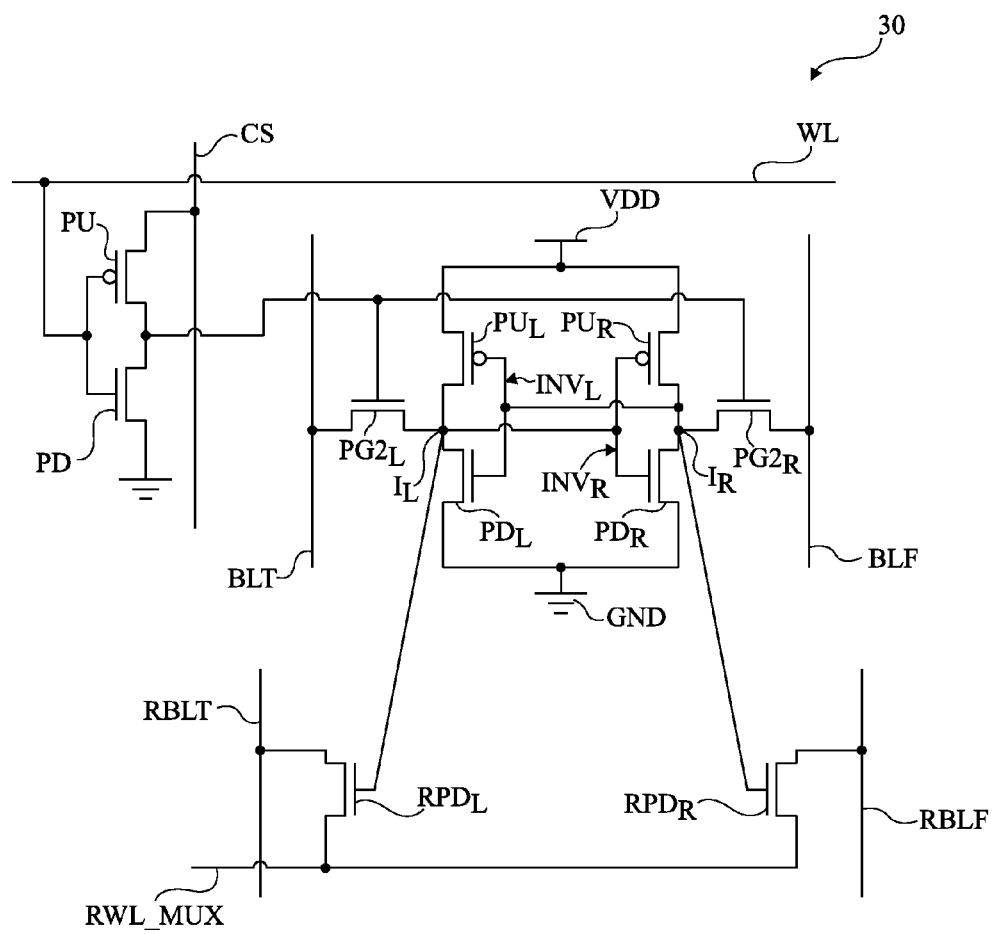
FIGS. 6 and 7 show other embodiments of volatile memory cells of decreased power supply voltage.

FIG. 6 shows another embodiment of a memory cell 30. As compared with memory cell 10 shown in FIG. 2, memory cell 30 comprises two additional inverter-assembled MOS transistors. Further, transistor PGL is replaced with an N-type MOS transistor, PG2L, and transistor PGR is replaced with an N-type MOS transistor, PG2R. More specifically, memory cell 30 comprises a P-type MOS transistor, PU, having its gate connected to word line WL, having its source connected to a control line CS, and having its drain connected to the gates of transistors PG2L and PG2R. Memory cell 30 further comprises an N-type MOS transistor, PD, having its gate connected to word line WL, having its source connected to ground GND, and having its drain connected to the gates of transistors PG2L and PG2R. Control line CS is connected to each memory cell of the column containing memory cell 30.

Further, word line RWL of memory cell 10 is replaced with a word line RWL_MUX which is only connected to some of the memory cells of the row, as described previously in relation with memory cell 20.

Memory cell 30 operates as follows.

In the absence of any read or write operation in the row containing memory cell 30, the states of the word, bit, and control lines are the following:

write word line WL is in the high state;
control line CS is in the low state;
write bit line BLT is in the low state;
write bit line BLF is in the low state;
read bit line RBLT is in the high state;
read bit line RBLF is in the high state; and
the read word lines RWL_MUX associated with the row containing memory cell 30 are in the high state.

As a variation, control line CS may be taken to a negative voltage, for example, on the order of −0.3 V. This enables to decrease leakage currents through switches PG2L and PG2R.

In an operation of writing of a datum "0" (respectively of a datum "1") into memory cell 30, the states of the word, bit, and control lines are the following:

write word line WL is in the low state;
control line CS is in the high state;
write bit line BLT is in the low state (respectively in the high state);
write bit line BLF is in the high state (respectively in the low state);
read bit line RBLT is in the high state;
read bit line RBLF is in the high state; and
the read word lines RWL_MUX associated with the row containing memory cell 30 are in the high state.

The structure of memory cell 30 enables to perform an individual selection of memory cells from among the memory cells of a same row in write operations. For the unselected memory cells of the same row, write word line WL is in the low state and the associated control lines CS are in the low state. Switches PG2L and PG2R of these cells are thus off. The leakage currents of the unselected memory cells 30 are smaller than the parasitic currents appearing for the unselected memory cells 10 for which switches PGL and PGR remain off in a write operation. The memory consumption is thus decreased in a write operation.

In an operation of reading of the datum stored in memory cell 30, the states of the word, bit, and control lines are the following:

write word line WL is in the high state;
control line WL CS is in the low state;
write bit line BLT is in the low state;
write bit line BLF is in the low state;
read bit lines RBLT and RBLF are initially floating in the high state; and
read word line RWL_MUX associated with memory cell 30 is in the low state while the read word lines associated with the unselected memory cells of the row are in the high state.

As a variation, control line CS may be taken to a negative voltage, for example, on the order of −0.3 V. This enables to decrease leakage currents through switches PG2L and PG2R.

Since read word lines RWL_MUX of the unselected memory cells are maintained in the high state and the associated read bit lines RBLT and RBLF are in the high state, there is no leakage current for these memory cells. The memory consumption in a read operation is thus decreased.

Memory cell 30 eases the implementation of a bit interleaving method in read and write mode, as previously described in relation with memory cell 20.

Figure 7:
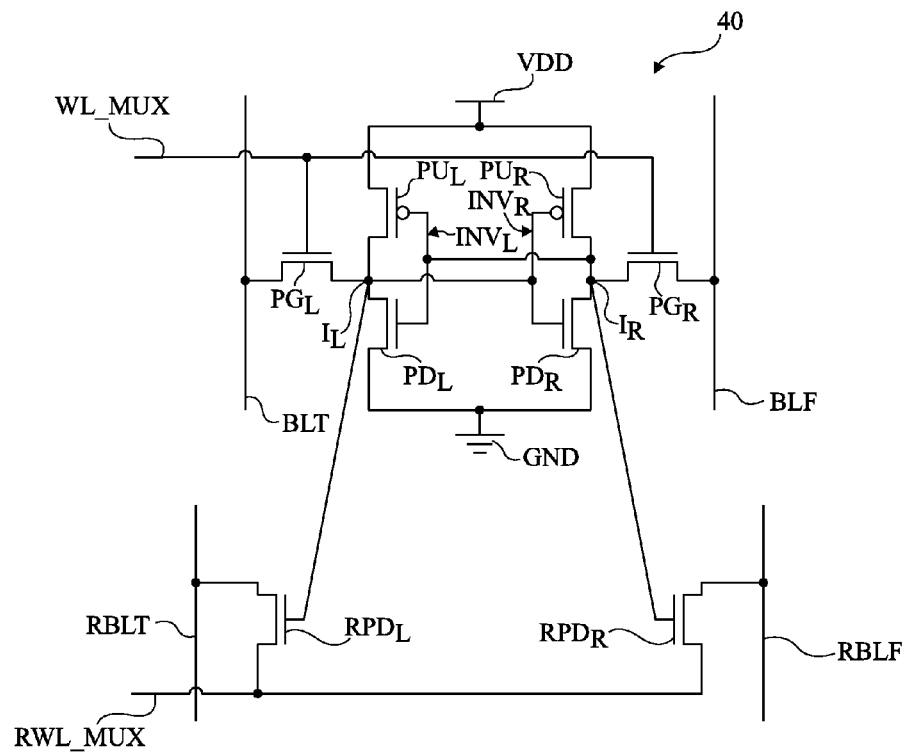

FIG. 7 shows another embodiment of a volatile memory cell 40. As compared with memory cell 10 shown in FIG. 2, read word line RWL of memory cell 10 is replaced with a word line RWL_MUX, which is only connected to some memory cells of the row containing memory cell 40, as previously described in relation with memory cell 20. Thereby, the memory comprises, for each row, several word lines RWL_MUX, each word line RWL_MUX being connected to a different group of memory cells of the row.

Further, write word line WL of memory cell 10 is replaced with a write word line WL_MUX, which is only connected to some of the memory cells of the row containing memory cell 40. Thereby, the memory comprises, for each row, several write word lines WL_MUX, each write word line WL_MUX being connected to a different group of memory cells of the row. The memory cells of a same group are connected to the same write word line WL_MUX and to the same read word line RWL_MUX.

Memory cell 40 operates as follows.

In the absence of any read or write operation in the row containing memory cell 40, the states of the word, bit, and control lines are the following:
- the write word lines WL_MUX associated with the row containing memory cell 40 are in the low state;
- write bit line BLT is in the low state;
- write bit line BLF is in the low state;
- read bit line RBLT is in the high state;
- read bit line RBLF is in the high state; and
- the read word lines RWL_MUX associated with the row containing memory cell 40 are in the high state.

In an operation of writing of a datum "0" (respectively of a datum "1") into memory cell 40, the states of the word, bit, and control lines are the following:
- the write word line WL_MUX associated with the row containing the memory cell is in the high state while the write word lines associated with the unselected memory cells of the row are in the low state;
- write bit line BLT is in the low state (respectively in the high state);
- write bit line BLF is in the high state (respectively in the low state);
- read bit line RBLT is in the high state;
- read bit line RBLF is in the high state; and
- the read word lines RWL_MUX associated with the row containing the memory cell are in the high state.

The structure of memory cell 40 enables to select groups of memory cells from among the memory cells of a same row in write operations. For the unselected memory cells of the same row, write word line WL_MUX is in the low state. Switches PGL and PGR of these cells are thus off. The leakage currents of the unselected memory cells 40 are smaller than the parasitic currents appearing for the unselected memory cells 10 for which switches PGL and PGR remain off in a write operation. The memory consumption is thus decreased in a write operation.

In an operation of reading of the datum stored in memory cell 40, the states of the word, bit, and control lines are the following:
- write word lines WL_MUX associated with the row containing memory cell 40 are in the low state;
- write bit line BLT is in the low state;
- write bit line BLF is in the low state;
- read bit lines RBLT and RBLF are initially floating in the high state; and
- the read word line RWL_MUX associated with memory cell 40 is in the low state while the read word lines associated with the unselected memory cells of the row are in the high state.

Since the read word lines RWL_MUX of the unselected memory cells are maintained in the high state and the associated read bit lines RBLT and RBLF are in the high state, there is no leakage current for these memory cells. The memory consumption in a read operation is thus decreased.

Memory cell 40 eases the implementation of a bit interleaving in write and in read mode.

Figure 8:
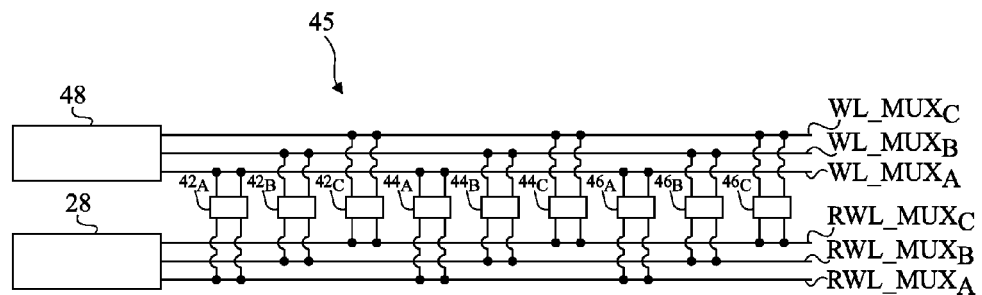
FIG. 8 schematically shows a row of a volatile memory comprising memory cells such as shown in FIG. 7.

FIG. 8 schematically shows memory cells 42A, 42B, 42C, 44A, 44B, 44C and 46A, 46B, 46C of a row of a volatile memory 45. Memory 45 further comprises three read word lines RWL_MUXA, RWL_MUXB, and RWL_MUXC associated with the row and three write word lines WL_MUXA, WL_MUXB, and WL_MUXC associated with the row. Read word lines RWL_MUXA, RWL_MUXB, and RWL_MUXC are connected to a multiplexing unit 28. Write word lines WL_MUXA, WL_MUXB, and WL_MUXC are connected to a multiplexing unit 48. As an example, read word line RWL_MUXA and write word line WL_MUXA are only connected to memory cells 42A, 44A, and 46A. Read word line RWL_MUXB and write word line WL_MUXB are only connected to memory cells 42B, 44B, and 46B and read word line RWL_MUXC and write word line WL_MUXC are only connected to memory cells 42C, 44C, and 46C. The number of read word lines and of write word lines depends on the number of groups of memory cells to be selected separately from the other memory cells in the row.

In write mode, the bit interleaving method may be implemented by write word lines WL_MUXA, WL_MUXB, WL_MUXC. As an example, when a read operation must be carried out in memory cells 42A, 44A, and 46A, write line WL_MUXA is set to the high state while the other write lines WL_MUXB and WL_MUXC are maintained in the low state. In read mode, the interleaving method may be implemented by read word lines RWL_MUXA, RWL_MUXB, RWL_MUXC. As an example, when a read operation must be carried out in memory cells 22A, 24A, and 26A, read line RWL_MUXA is set to the low state while the other read lines RWL_MUXB and RWL_MUXC are maintained in the high state.

Specific embodiments of the present invention have been described. Various alterations and modifications will occur to those skilled in the art. In particular, the N or P type of at least some of the MOS transistors described in the previous embodiments may be inverted. It should further be noted that those skilled in the art may combine various elements of these various embodiments and variations without showing any inventive step. In particular, a memory may comprise memory cells having different structures according to one of the embodiments previously described in relation with FIGS. 4, 6, and 7. Further, in a retention operation, power supply voltage VDD of the memory cells may be decreased with respect to a read or write operation. As an example, in a retention operation, voltage VDD may be on the order of 300 mV, especially when the memory cells are formed in a technology for which the channel length of MOS transistors is 32 nm.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A volatile memory comprising:
volatile memory cells adapted to perform data write and read operations, the memory cells being arranged in rows and columns and, further, being distributed in separate groups of memory cells for each row;
a first memory cell selection circuit configured to perform write operations;
a second memory cell selection circuit, different from the first circuit, configured to perform read operations;

wherein the first memory cell selection circuit is configured to select, for each row, memory cells from one of the group of memory cells for a write operation;
wherein the first memory cell selection circuit is configured to select, for each row, memory cells from one of the groups of memory cells for a read operation;
wherein the second memory cell selection circuit comprises read word lines for each row, each read word line being connected to all the memory cells of one of the groups of memory cells;
wherein each memory cell comprises:
first and second inverters, an output of the first inverter being connected to, an input of the second inverter and, an output of the second inverter being connected to, an input of the first inverter;
a first switch connected to the output of the first inverter;
a second switch connected to the output of the second inverter;
a first MOS transistor having two conduction terminals and a first gate, the first gate being connected to the output of the first inverter;
a second MOS transistor having two conduction terminals and a second gate, the second gate being connected to the output of the second inverter;
wherein each read word line is connected to one of the conduction terminals of the first MOS transistor and to one of the conduction terminals of the second MOS transistor; and
wherein the first selection circuit comprises a circuit configured to turn on the first and second switches of one of the groups of memory cells.

2. The volatile memory of claim 1, comprising first and second read bit lines for each column; and
wherein, for at least some memory cells of each column, the other one of the first conduction terminals of the first MOS transistor is connected to the first read bit line and the other one of the second conduction terminals of the second MOS transistor is connected to the second read bit line.

3. The volatile memory of claim 1, wherein the first switch comprises a third MOS transistor connecting the output of the first inverter to a first write bit line; and
wherein the second switch comprises a fourth MOS transistor connecting the output of the second inverter to a second write bit line.

4. The volatile memory of claim 3, wherein the first selection circuit comprises write word lines for each row, each write word line being connected to the gates of the third and fourth MOS transistors of the memory cells of one of the groups of memory cells.

5. The volatile memory of claim 3, wherein the first selection circuit comprises a third inverter, an output of the third inverter being connected to the gates of the third and fourth transistors and, an input of the third inverter being connected to a write word line.

6. The volatile memory of claim 3, wherein the first selection circuit comprises a fifth MOS transistor interposed between the third MOS transistor and the first write bit line and a sixth MOS transistor interposed between the fourth MOS transistor and the second write bit line.

7. An electronic device comprising a battery and the memory of claim 1, powered by the battery.

8. A method for reading data stored in a volatile memory, wherein the volatile memory comprises:
volatile memory cells adapted to perform data write and read operations, the memory cells being arranged in rows and columns and, further, being distributed in separate groups of memory cells for each row;
a first memory cell selection circuit configured to perform write operations;
a second memory cell selection circuit, different from the first circuit, configured to perform read operations;
wherein the first memory cell selection circuit is configured to select, for each row, memory cells from one of the group of memory cells for a write operation;
wherein the first memory cell selection circuit is configured to select, for each row, memory cells from one of the groups of memory cells for a read operation;
wherein the second memory cell selection circuit comprises read word lines for each row, each read word line being connected to all the memory cells of one of the groups of memory cells; and
wherein the method comprises, for a memory row, setting to a first level of one of the read word lines associated with the row while the other read word lines associated with the row are maintained at a second level greater than the first level.

9. The method of claim 8, wherein the first level comprises ground.

10. The method of claim 8, wherein the second level is generated from a battery.

11. The method of claim 8, wherein the first selection circuit is configured to be controlled by a first MOS transistor interposed between the memory cell and a first write bit line and a second MOS transistor interposed between the memory cell and a second write bit line.

12. The method of claim 8, wherein the first selection circuit is configured to be controlled by a third inverter, an output of the inverter being connected to the memory cell and an input of the third inverter being connected to a write word line.

13. The method of claim 8, wherein the first selection circuit is configured to be controlled with a write word line for each row, each write word line being connected to the memory cells of one of the groups of memory cells.

14. A memory comprising:
a write selection circuit configured to select, for each row, memory cells from one group of memory cells for a write operation;
a read selection circuit, different from the write circuit, configured to select, for each row, memory cells from one group of memory cells for a read operation; and
a plurality of memory cells arranged in rows and columns and being distributed in separate groups of memory cells for each row, wherein each memory cell comprises:
first and second inverters, an output of the first inverter being coupled to an input of the second inverter and an output of the second inverter being coupled to an input of the first inverter;
a first switch with a current path coupled between the output of the first inverter and a word line;
a second switch with a current path coupled between the output of the second inverter and the word line;
a first MOS transistor having a gate coupled to the output of the first inverter; and
a second MOS transistor having a gate coupled to the output of the second inverter.

15. The memory of claim 14, wherein the write selection circuit comprises a word line multiplexer.

16. The memory of claim 14, wherein the write selection circuit comprises a plurality of word lines extending along the rows, and a plurality of control lines extending along the columns, wherein each control line is configured to enable a selection operation of the word lines of the memory cells of an associated row; and wherein each memory cell further comprises a control circuitry coupled between the word line and the first and second switches.

17. The memory of claim 16, wherein the control circuitry comprises a third inverter, wherein the inverter has an input coupled to the word line, a conduction terminal coupled to the control line, and an output coupled to control terminals of the first and second switches.

18. The memory of claim 16, wherein the control circuitry comprises:

a third switch with a current path coupled in series with the current path of the first switch between the output of the first inverter and the word line; and a fourth switch with a current path coupled in series with the current path of the second switch between the output of the second inverter and the word line.

* * * * *

UNITED STATES PATENT AND TRADEMARK OFFICE
CERTIFICATE OF CORRECTION

PATENT NO. : 8,891,317 B2
APPLICATION NO. : 13/758536
DATED : November 18, 2014
INVENTOR(S) : Anis Feki et al.

Page 1 of 1

It is certified that error appears in the above-identified patent and that said Letters Patent is hereby corrected as shown below:

In the Specification

In Col. 8, line 40, Detailed Description of Illustrative Embodiments, delete "WL CS" and insert --CS--.

Signed and Sealed this
Tenth Day of March, 2015

Michelle K. Lee
*Deputy Director of the United States Patent and Trademark Office*